US012597920B2

(12) United States Patent
Wu

(10) Patent No.: US 12,597,920 B2
(45) Date of Patent: Apr. 7, 2026

(54) POWER SWITCH CIRCUIT

(71) Applicant: uPI Semiconductor Corp., Hsinchu County (TW)

(72) Inventor: Chia Lung Wu, Hsinchu County (TW)

(73) Assignee: uPI Semiconductor Corp., Hsinchu County (TW)

( * ) Notice: Subject to any disclaimer, the term of this patent is extended or adjusted under 35 U.S.C. 154(b) by 114 days.

(21) Appl. No.: 18/632,238

(22) Filed: Apr. 10, 2024

(65) Prior Publication Data

US 2024/0364322 A1 Oct. 31, 2024

(30) Foreign Application Priority Data

Apr. 25, 2023 (TW) ................................. 112115243

(51) Int. Cl.
*H03K 17/082* (2006.01)
(52) U.S. Cl.
CPC ................................. *H03K 17/0822* (2013.01)
(58) Field of Classification Search
CPC ................................................. H03K 17/0822
See application file for complete search history.

(56) References Cited

U.S. PATENT DOCUMENTS

| | | | |
|---|---|---|---|
| 7,940,505 B1 | 5/2011 | Sadate et al. | |
| 8,283,905 B2 * | 10/2012 | Chang | H02M 3/156 |
| | | | 323/273 |
| 9,467,136 B1 | 10/2016 | Nguyen | |
| 9,812,963 B1 * | 11/2017 | Nguyen | H02M 3/1588 |
| 9,973,183 B2 | 5/2018 | Zhu et al. | |
| 10,418,986 B2 | 9/2019 | Nguyen et al. | |
| 11,025,046 B2 * | 6/2021 | Wu | H02H 9/025 |
| 11,463,080 B2 | 10/2022 | Wu | |
| 2022/0166424 A1 | 5/2022 | Wu et al. | |

* cited by examiner

*Primary Examiner* — Menatoallah Youssef
*Assistant Examiner* — Colleen J O Toole
(74) *Attorney, Agent, or Firm* — JCIPRNET

(57) ABSTRACT

A power switch circuit is provided. The power switch circuit includes a power switch, a sensing circuit, a selecting circuit and a modulating circuit. The power switch has an output terminal for providing an output voltage and an output current. The sensing circuit is coupled to the power switch, senses the output current and outputs a current sensing signal. The selecting circuit is respectively coupled to the output terminal and the sensing circuit. The selecting circuit controls the sensing circuit according to the output voltage, so that the sensing circuit selectively outputs a first sensing current or a second sensing current as the current sensing signal. The modulating circuit is coupled to the sensing circuit and a control terminal of the power switch. The modulating circuit outputs a controlling voltage to the control terminal of the power switch, and modulates the controlling voltage according to the current sensing signal.

11 Claims, 5 Drawing Sheets

600A

600B

600C

600D

POWER SWITCH CIRCUIT

CROSS-REFERENCE TO RELATED APPLICATION

This application claims the priority benefit of Taiwan application serial no. 112115243, filed on Apr. 25, 2023. The entirety of the above-mentioned patent application is hereby incorporated by reference herein and made a part of this specification.

BACKGROUND

Technical Field

The disclosure relates to a power switch circuit, and in particular relates to a current limit protection circuit of a power switch circuit.

Description of Related Art

Generally speaking, the power switch circuit senses the output current of the power switch using a sensing transistor matched with the power transistor, and provides a current sensing signal related to the output current to a current limit circuit. The current limit circuit limits the output current by modulating the controlling voltage of the power switch to implement an over current protection (OCP) mechanism.

However, when the output current of the power switch circuit is limited, continuing to increase the load causes the output voltage to drop. When the output voltage drops to close to 0V (e.g., below 0.7V) due to current limitation, the node (hereinafter referred to as the sensing node) between the sensing transistor and the current limit circuit forms a voltage difference with the output terminal of the power switch due to the voltage offset caused by the current limit circuit. This results in an error between the output current sensing result and the actual value, thus causing an error in the over current protection. This low output voltage over current protection is referred to as short circuit protection (SCP).

In some solutions, the power switch circuit uses a second set of current protection circuits to implement a short circuit protection mechanism that is only enabled when the output voltage is less than a threshold. The output current is clamped by locking the power switch controlling voltage. The output current cannot be sensed during the short circuit protection period, causing an error in the output voltage. On the other hand, since the controlling voltages of the power switches come from different protection circuits, the output voltage oscillates during the controlling voltage switching period.

It should be noted that the content of the "BACK-GROUND" section is used to help understand the disclosure. Some of the content (or all of the content) disclosed in the "BACKGROUND" section may not be known by those of ordinary skill in the art. The content disclosed in the "BACKGROUND" section does not mean that the content has been known to those with ordinary knowledge in the technical field before the application of the disclosure.

SUMMARY

A power switch circuit that may improve the accuracy of the over current protection is provided in the disclosure.

The power switch circuit of the embodiment of the disclosure includes a power switch, a sensing circuit, a selecting circuit, and a modulating circuit. The power switch has an output terminal for providing an output voltage and an output current. The sensing circuit is coupled to the power switch. The sensing circuit senses the output current and outputs a current sensing signal. The selecting circuit is respectively coupled to the output terminal and the sensing circuit. The selecting circuit controls the sensing circuit according to the output voltage, so that the sensing circuit selectively outputs a first sensing signal or a second sensing signal as the current sensing signal. The modulating circuit is coupled to the sensing circuit and a control terminal of the power switch. The modulating circuit outputs a controlling voltage to the control terminal of the power switch, and modulates the controlling voltage according to the current sensing signal.

In this embodiment, the sensing circuit includes a sensing node, a first current sensing circuit, and a second current sensing circuit. The sensing node is coupled to the modulating circuit. The sensing node outputs the current sensing signal. The first current sensing circuit is coupled between the power switch and the sensing node. The first current sensing circuit generates the first sensing signal related to the output current. The second current sensing circuit is coupled between the power switch and the sensing node. The second current sensing circuit generates the second sensing signal related to the output current.

In this embodiment, when the output voltage is higher than a preset value, the selecting circuit controls the sensing circuit to output the first sensing signal to the sensing node. When the output voltage is lower than the preset value, the selecting circuit controls the sensing circuit to output the second sensing signal to the sensing node.

In this embodiment, during a switching period in which the sensing circuit selectively outputs the first sensing signal or the second sensing signal as the current sensing signal, the sensing circuit simultaneously outputs the first sensing signal and the second sensing signal to the sensing node.

In this embodiment, the first current sensing circuit is coupled to a sensing transistor in the power switch. The first current sensing circuit is configured to sense the output current to generate the first sensing signal.

In this embodiment, the second current sensing circuit is coupled to a sensing resistor in the power switch. The second current sensing circuit is configured to sense the output current to generate the second sensing signal.

In this embodiment, the first sensing circuit includes a first current mirror. The second sensing circuit includes a second current mirror. The first current mirror and the second current mirror are coupled to the sensing node. The first current mirror and the second current mirror are matched with each other.

In this embodiment, the sensing circuit includes an isolation circuit. The isolation circuit is coupled between the first sensing circuit and a ground terminal, and between the second sensing circuit and the ground terminal. The isolation circuit isolates the first sensing circuit and the second sensing circuit in a high voltage domain relative to the ground terminal.

In this embodiment, the first current sensing circuit and the second current sensing circuit have the same circuit architecture and the same layout area.

In this embodiment, the modulating circuit includes a voltage locking circuit. The voltage locking circuit is coupled to the sensing node. The voltage locking circuit is configured to lock a voltage of the sensing node at a first reference voltage.

In this embodiment, the modulating circuit includes a conversion circuit and an error amplification circuit. The conversion circuit is coupled to the sensing circuit. The conversion circuit converts the current sensing signal into a sensing voltage. The error amplifier circuit is coupled to the conversion circuit and the control terminal of the power switch. The error amplifier circuit respectively receives the sensing voltage and a second reference voltage, and is configured to generate the controlling voltage.

In this embodiment, the power switch has an input terminal and includes a sensing resistor, a first sensing transistor, a second sensing transistor, and a power transistor. The first terminal of the sensing resistor is coupled to the input terminal. The first sensing transistor has a control terminal receiving a controlling voltage. A first terminal of the first sensing transistor is coupled to a second terminal of the sensing resistor. A second terminal of the first sensing transistor is coupled to the output terminal. The second sensing transistor has a control terminal receiving the controlling voltage. The first terminal of the second sensing transistor is coupled to the input terminal. The power transistor has a control terminal receiving the controlling voltage. A first terminal of the power transistor is coupled to the input terminal. A second terminal of the power transistor is coupled to the output terminal. The sensing circuit is respectively coupled to a second terminal of the sensing resistor, the output terminal, and a second terminal of the second sensing transistor.

In this embodiment, the first sensing transistor, the second sensing transistor, and the power transistor are matched with each other.

In this embodiment, the first sensing transistor and the second sensing transistor have the same layout area.

Based on the above, the power switch circuit of the embodiment of the disclosure uses two different sensing circuits to sense the output current. The sensing circuit is switched according to the output voltage to output the sensing signal, so when the output voltage drops to 0V, the power switch circuit may still perform current sensing. Through matching circuit design, the current sensing signals may be connected without any gap, thereby achieving complete current protection and improving the accuracy of current protection.

In order to make the above-mentioned features and advantages of the disclosure comprehensible, embodiments accompanied with drawings are described in detail below.

DETAILED DESCRIPTION OF DISCLOSED EMBODIMENTS

A portion of the embodiments of the disclosure will be described in detail with reference to the accompanying drawings. Element symbol referenced in the following description will be regarded as the same or similar element when the same element symbol appears in different drawings. These examples are only a portion of the disclosure and do not disclose all possible embodiments of the disclosure. More precisely, these embodiments are only examples within the scope of the patent application of the disclosure.

Figure 1:
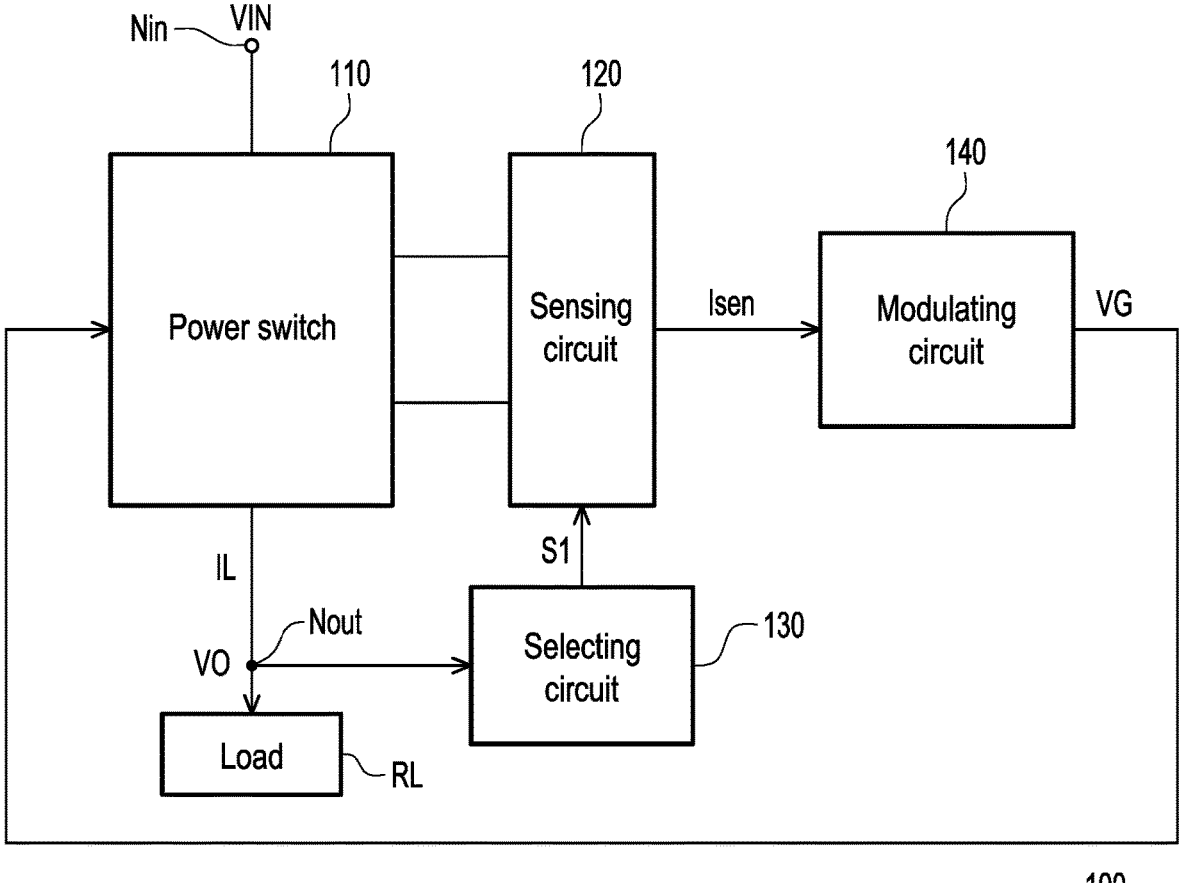
FIG. 1 is a circuit block diagram of a power switch circuit according to an embodiment of the disclosure.

FIG. 1 is a circuit block diagram of a power switch circuit according to an embodiment of the disclosure. Referring to FIG. 1, in the power switch circuit 100, the input terminal Nin of the power switch 110 receives the input voltage VIN. The output terminal Nout of the power switch 110 is coupled to the load RL and the selecting circuit 130. The power switch circuit 100 may generate the output voltage VO and the output current IL at the output terminal Nout based on the input voltage VIN, so that the load RL operates according to the output voltage VO and the output current IL. The power switch circuit 100 may include a power switch 110, a sensing circuit 120, a selecting circuit 130, and a modulating circuit 140, and may be implemented in the form of a single-chip integrated circuit.

In this embodiment, the sensing circuit 120 is coupled between the power switch 110 and the modulating circuit 140. The sensing circuit 120 senses the output current IL output by the power switch 110 (i.e., the current flowing through the power switch 110) to generate a current sensing signal Isen, and outputs the current sensing signal Isen to the modulating circuit 140.

In this embodiment, the selecting circuit 130 is coupled to the output terminal Nout of the power switch 110 to receive the output voltage VO, and generates the selection signal S1 according to the output voltage VO. The selecting circuit 130 is also coupled to the sensing circuit 120 and outputs the selection signal S1 to the sensing circuit 120 to control the sensing circuit 120. In this embodiment, the sensing circuit 120 is controlled by the sensing circuit 120 and selectively outputs a first sensing signal or a second sensing signal as the current sensing signal Isen according to the selection signal S1.

That is, the selecting circuit 130 may control the sensing circuit 120 to operate in different sensing modes according to the output voltage VO, so that the sensing circuit 120 generates a corresponding current sensing signal. The different sensing modes may be, for example, an over current protection (OCP) mode and a short circuit protection (SCP) mode. The over current protection mode may be, for example, an operation mode when the voltage value of the output voltage VO is greater than a preset value. The short circuit protection mode may be, for example, an operation mode when the voltage value of the output voltage VO is too low (e.g., between a preset value and a ground voltage value).

In this embodiment, the modulating circuit 140 is coupled to the sensing circuit 120 to receive the current sensing signal Isen, and generates the controlling voltage VG according to the current sensing signal Isen. The modulating circuit 140 is also coupled to the control terminal of the power switch 110 to output the controlling voltage VG to the control terminal of the power switch 110 to modulate the on-resistance of the power switch 110. When the current value of the current sensing signal Isen exceeds the preset value and indicates that the current value of the output current IL is too large, the modulating circuit 140 increases the on-resistance of the power switch 110 by reducing the voltage value of the controlling voltage VG, thereby achieving the effect of limiting the output current IL.

Figure 2:
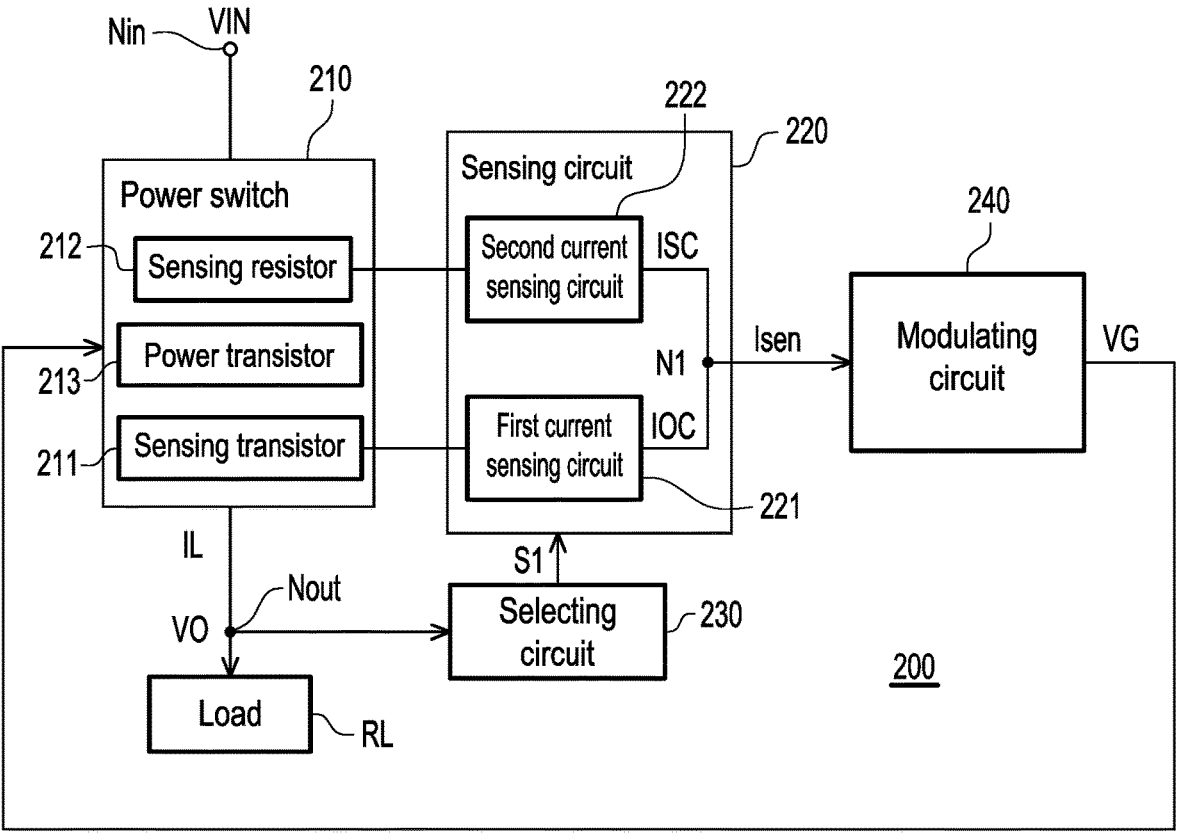
FIG. 2 is a circuit block diagram of a power switch circuit according to an embodiment of the disclosure.

FIG. 2 is a circuit block diagram of a power switch circuit according to an embodiment of the disclosure. Referring to FIG. 2, the power switch circuit 200 may include a power switch 210, a sensing circuit 220, a selecting circuit 230 and a modulating circuit 240. The connection relationship of the power switch circuit 200 is the same as that of the power switch circuit 100 and are not repeated herein.

In this embodiment, the power switch 210 may include a sensing transistor 211, a sensing resistor 212, and a power transistor 213. These elements 211 to 213 are respectively coupled to the input voltage VIN and the output voltage VO.

In this embodiment, the sensing circuit 220 may include a sensing node N1, a first current sensing circuit 221, and a second current sensing circuit 222. The first current sensing circuit 221 is coupled between the power switch 210 and the sensing node N1. The second current sensing circuit 222 is coupled between the power switch 210 and the sensing node N1. The sensing circuit 220 switches the first current sensing circuit 221 and the second current sensing circuit 222 according to the selection signal S1 output by the selecting circuit 230 to generate or provide the first sensing signal IOC or the second sensing signal ISC to the sensing node N1. The sensing node N1 is also coupled to the modulating circuit 240 to output the first sensing signal IOC or the second sensing signal ISC as the current sensing signal Isen.

Specifically, the first current sensing circuit 221 may operate when the voltage value of the output voltage VO is greater than the preset value to achieve over current protection. The input terminal of the first current sensing circuit 221 is coupled to the sensing transistor 211 in the power switch 210. The first current sensing circuit 221 is coupled to the modulating circuit 240 through the sensing node N1. The first current sensing circuit 221 is also coupled to the selecting circuit 230. In this embodiment, the first current sensing circuit 221 is enabled based on the selection signal S1 to sense the output current IL to generate and output the first sensing signal IOC to the sensing node N1.

In this embodiment, the second current sensing circuit 222 may be enabled when the voltage value of the output voltage VO is less than the preset value to achieve short circuit protection. The input terminal of the second current sensing circuit 222 is coupled to the sensing resistor 212 in the power switch 210. The second current sensing circuit 222 is coupled to the modulating circuit 240 through the sensing node N1. The second current sensing circuit 222 is also coupled to the selecting circuit 230. In this embodiment, the second current sensing circuit 222 is enabled based on the selection signal S1 to sense the output current IL to generate and output the second sensing signal ISC to the sensing node N1.

That is, the current sensing circuits 221 and 222 may switch according to different output voltages VO. Therefore the power switch circuit 200 may actually sense the output current IL in response to the output voltage VO to implement the corresponding current protection mechanism (i.e., over current protection and short circuit protection).

Figure 3:
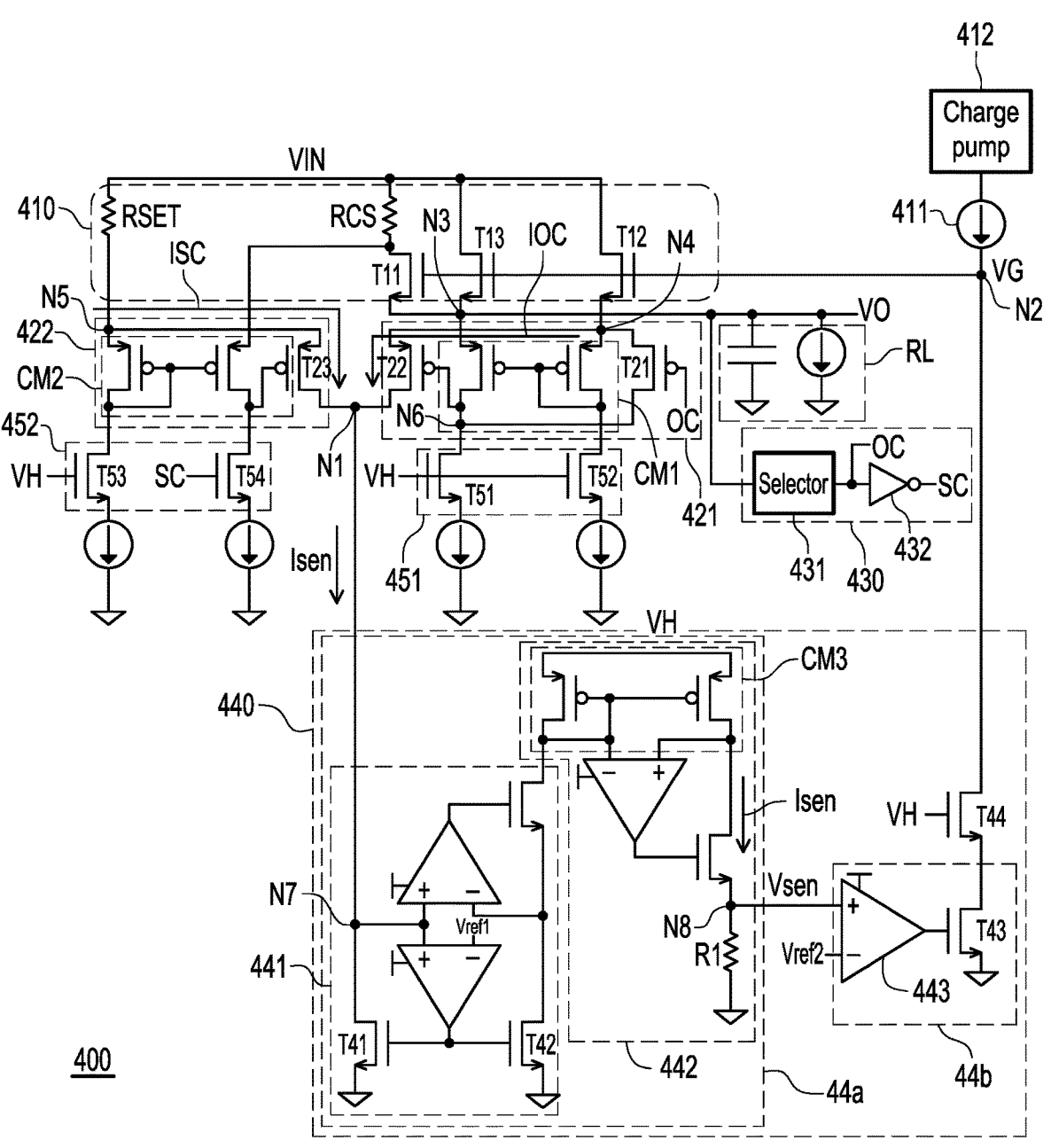
FIG. 3 is a circuit schematic diagram of a power switch circuit according to an embodiment of the disclosure.

FIG. 3 is a circuit schematic diagram of a power switch circuit according to an embodiment of the disclosure. Referring to FIG. 3, the power switch circuit 400 may include a current source 411, a charge pump 412, a power switch 410, a first current sensing circuit 421, a second current sensing circuit 422, a selecting circuit 430, a modulating circuit 440, and isolation circuits 451 to 452. The circuits 410 to 440 and 421 to 422 in FIG. 3 may be deduced by referring to the related description of the power switch circuit 200, and therefore are not repeated herein. In this embodiment, the current source 411 and the charge pump 412 are coupled in series to the node N2 for supplying the current required to turn on the power switch 410. The node N2 may be a control terminal of the power switch 410 for receiving the controlling voltage VG from the modulating circuit 440.

In the embodiment of FIG. 3, the power switch 410 may include a first resistor RSET, a second resistor RCS, a first sensing transistor T11, a second sensing transistor T12, and a power transistor T13. The first terminal of the first resistor RSET and the first terminal of the second resistor RCS receive the input voltage VIN. In this embodiment, the first resistor RSET and the second resistor RCS may be referred to as sensing resistors and are matched with each other. The ratio of the output current IL to the sensing signal (e.g., the sensing signal ISC) may be set by selecting the resistance value of the first resistor RSET.

In this embodiment, the first sensing transistor T11, the second sensing transistor T12 and the power transistor T13 are respectively implemented by an n-type metal-oxide-semiconductor field-effect transistor (NMOSFET). In this embodiment, the transistors T11 to T13 are matched with each other. The aforementioned matching may be, for example, that the transistor size, threshold voltage value, layout area, and other transistor-related parameters or a combination thereof are equal. In this embodiment, the first sensing transistor T11 and the second sensing transistor T12 also have the same layout area, so the transistors T11 and T12 may respond to the output current IL to generate the same sensing signal (e.g., the sensing signal IOC).

In this embodiment, the power transistor T13 provides the output voltage VO to the node N3 (i.e., the output terminal of the power switch circuit 400) based on the input voltage VIN. In detail, respective control terminals (i.e., gate terminals) of the first sensing transistor T11, the second sensing transistor T12, and the power transistor T13 are coupled to the node N2 to receive the controlling voltage VG. The first terminal (i.e., the drain terminal) of the first sensing transistor T11 is coupled to the second terminal of the second resistor RCS. The second terminal (i.e., the source terminal) of the first sensing transistor T11 is coupled to the first current sensing circuit 421 and the load RL at the node N3. The first terminal (i.e., the drain terminal) of the second sensing transistor T12 is coupled to the input terminal of the power switch circuit 400 to receive the input voltage VIN. The second terminal (i.e., the source terminal) of the second sensing transistor T12 is coupled to the first current sensing circuit 421 at the node N4. The first terminal (i.e., the drain terminal) of the power transistor T13 is coupled to the input terminal of the power switch circuit 400 to receive the input voltage VIN. The second terminal (i.e., the source terminal) of the power transistor T13 is coupled to the first current sensing circuit 421 and the load RL at the node N3. In other words, the sensing circuits (i.e., the first current sensing circuit 421 and the second current sensing circuit 422) are respectively coupled to the second terminal of the second resistor RCS, the output terminal (i.e., the node N3) of the power switch circuit 400, and the second terminal (i.e., node N4) of the second sensing transistor T12.

In this embodiment, the first current sensing circuit 421 may include a first current mirror CM1 and transistors T21 to T22. In this embodiment, the transistor T21 is controlled by the selecting circuit 430 and performs a switch operation according to the first selection signal OC. The first current mirror CM1 outputs the first sensing signal IOC (i.e., the current flowing through the transistor T12) at the node N4 to the sensing node N1 through the transistor T22.

Specifically, in this embodiment, the first current mirror CM1 is respectively coupled to the transistors T11 to T13 at the nodes N3 and N4. The first current mirror CM1 may also be coupled to the isolation circuit 451 to isolate the first current sensing circuit 421 in a high voltage domain (e.g., 12 to 17V) relative to the ground voltage.

In this embodiment, the second current sensing circuit 422 may include a second current mirror CM2 and a transistor T23. In this embodiment, the second current sensing circuit 422 is controlled by the selecting circuit 430 through the transistor T54 in the isolation circuit 452, and the transistor T23 performs a switch operation according to the second selection signal SC. The second current mirror CM2 outputs the second sensing signal ISC (i.e., the current flowing through the resistor RSET) at the node N5 to the sensing node N1 through the transistor T23.

In this embodiment, the second current mirror CM2 is respectively coupled to the resistors RSET, RCS, and the transistor T23. The second current mirror CM2 may also be coupled to the isolation circuit 452 to isolate the second current sensing circuit 422 in a high voltage domain relative to the ground voltage.

In this embodiment, the first current mirror CM1 and the second current mirror CM2 are coupled to the sensing node N1. The first current mirror CM1 and the second current mirror CM2 are matched with each other to generate the same sensing signal IOC or ISC. The aforementioned matching may be, for example, that the layout area of the circuit and the related parameters of multiple transistors therein, or a combination thereof are equal.

It should be noted that since the signal source sensed by the first current sensing circuit 421 is the sensing transistor T12, the first current sensing circuit 421 may generate an accurate sensing result (i.e., the first sensing signal IOC) when the output voltage VO has a normal voltage value (e.g., greater than the preset value VOD, 1.8V). On the other hand, since the signal sources sensed by the second current sensing circuit 422 are the resistors RSET and RCS, the second current sensing circuit 422 may generate an accurate sensing result (i.e., the second sensing signal ISC) when the output voltage VO has a low voltage value (e.g., less than preset value VOD).

In this embodiment, the isolation circuits 451 and 452 may be integrated together and integrated with the current sensing circuits 421 and 422. The isolation circuit 451 is coupled between the first current sensing circuit 421 and the ground terminal. The isolation circuit 451 may be implemented through transistors T51 to T52.

In this embodiment, the isolation circuit 452 is coupled between the second current sensing circuit 422 and the ground terminal. The isolation circuit 452 may include transistors T53 to T54. In this embodiment, the control terminal (i.e., the gate terminal) of the transistor T54 receives the second selection signal SC to perform the switch operation. The other connection relationships, operations and functions of the isolation circuit 452 are the same as those of the isolation circuit 451 and are not repeated herein.

It should be noted that since the isolation circuit 451 is coupled between the first current sensing circuit 421 and the ground terminal, the isolation circuit 451 may isolate the first current sensing circuit 421 in a high voltage domain (e.g., 12 to 17V) relative to the ground terminal. The isolation circuit 452 is coupled between the second current sensing circuit 422 and the ground terminal, the isolation circuit 452 may isolate the second current sensing circuit 422 in a high voltage domain (e.g., 12 to 17V) relative to the ground terminal. In this way, the isolation circuit 451 and 452 may reduce the voltage difference when the sensing circuits 421 and 422 operate, so that the sensing circuits 421 and 422 may be implemented using low-voltage elements to reduce circuit costs.

In this embodiment, the selecting circuit 430 may include a selector 431 and an inverter 432. The selector 431 generates the first selection signal OC according to the output voltage VO and the preset value, or performs an inversion operation on the first selection signal OC through the inverter 432 to generate the second selection signal SC. In detail, the input terminal of the selector 431 is coupled to the node N3 to receive the output voltage VO. The output terminal of the selector 431 is coupled to the input terminal of the inverter 432 and the transistor T21. The output terminal of the inverter 432 is coupled to the transistor T54. In this embodiment, the selector 431 may be, for example, a logic gate circuit to implement the generation (or switch) operation of the selection signal.

In this embodiment, the modulating circuit 440 is coupled to the sensing circuits 421 and 422 at the node N1. The modulating circuit 440 may include a conversion circuit 44a and an error amplification circuit 44b. The conversion circuit 44a converts the current sensing signal Isen (i.e., the first sensing signal IOC or the second sensing signal ISC) into the sensing voltage Vsen. The error amplifier circuit 44b is coupled to the conversion circuit 44a and the respective control terminals (i.e., node N2) of the transistors T11 to T13. The error amplifier circuit 44b respectively receives the sensing voltage Vsen and the reference voltage Vref2. The error amplifier circuit 44b generates the controlling voltage VG according to the aforementioned voltages Vsen and Vref2.

Furthermore, the conversion circuit 44a may also include a voltage locking circuit 441. The voltage locking circuit 441 is coupled to the sensing node N1. The voltage locking circuit 441 locks the voltage at the node N7 (i.e., the sensing node N1) at the reference voltage Vref1, and copies the current sensing signal Isen on the sensing node N7 (i.e., N1) to the output terminal (i.e., the node N8) of the current copy circuit 442 through the current mirror circuit CM3 in the current copy circuit 442. In this embodiment, the voltage locking circuit 441 may be, for example, implemented as a voltage follower or a low dropout regulator (LDO).

The error amplifier circuit 44b may include an error amplifier 443 and a transistor T43. The non-inverting input terminal and the inverting input terminal of the error amplifier 443 respectively receive the sensing voltage Vsen and the reference voltage Vref2. The output terminal of the error amplifier 443 is coupled to the control terminal (i.e., the gate terminal) of the transistor T43 to change the on-resistance of the transistor T43 according to the sensing voltage Vsen and the reference voltage Vref2. The controlling voltage VG is generated at the node N2 based on the current generated by the on-resistance of the transistor T43 and the current generated by the current source 411. Thereby, the modulating circuit 440 may achieve the effect of modulating the controlling voltage VG according to the current sensing signal Isen.

It should be noted that since the voltage locking circuit 441 may fix the voltage on the sensing node N1 at the reference voltage Vref1 close to 0V (e.g., 0.2V), the voltage locking circuit 441 may reduce the lower limit value when the current sensing circuit 421 (or 422) operates. In this way, the power switch circuit 400 may be applied when the input voltage VIN is low (e.g., less than 3V).

Figure 4:
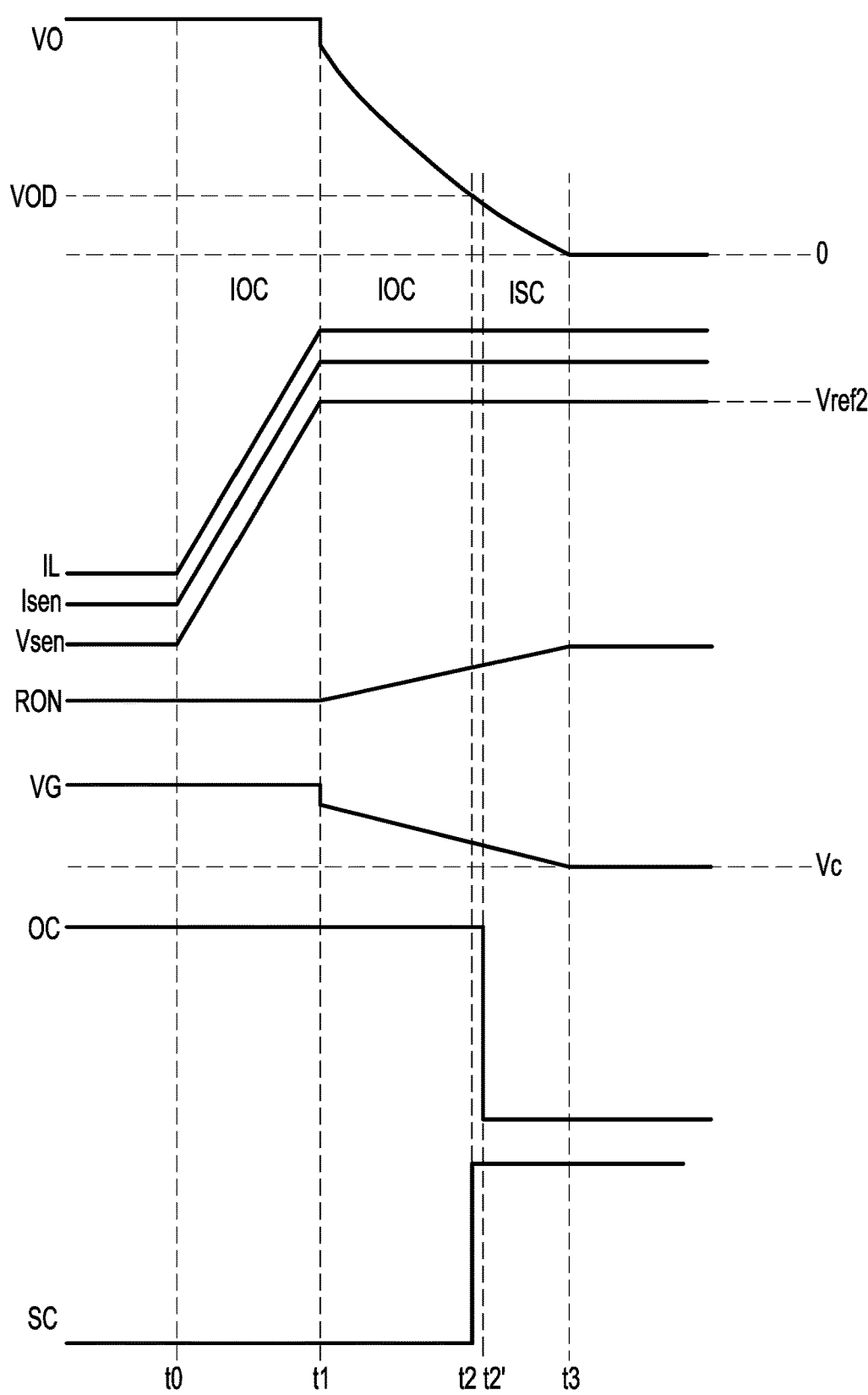
FIG. 4 is a schematic diagram of operating waveforms of the power switch circuit according to the embodiment of FIG. 3.

FIG. 4 is a schematic diagram of operating waveforms of the power switch circuit according to the embodiment of FIG. 3. In FIG. 4, the horizontal axis represents the operation time of the power switch circuit 400 and the vertical axis represents the voltage value.

Referring to FIG. 3 and FIG. 4, at time t0, the first current sensing circuit 421 is enabled, and the second current sensing circuit 422 is disabled to implement an over current protection mechanism. Specifically, the power switch circuit 400 is coupled to the load RL, so that the current value of the output current IL begins to rise. At this time, since the voltage value of the output voltage VO is higher than the preset value VOD (e.g., 1.8V), the first selection signal OC output by the selecting circuit 430 has a high voltage level (e.g., logic high), and the second selection signal SC has a low voltage level (e.g., logic low). The selecting circuit 430 controls the first current sensing circuit 421 so that the first current sensing circuit 421 is enabled based on the first selection signal OC to output the first sensing signal IOC as the current sensing signal Isen to the sensing node N1. That is, when the current value of the output current IL rises, the current value of the current sensing signal Isen and the voltage value of the sensing voltage Vsen rise synchronously.

At time t1, the current value of the output current IL rises to a current limit value, so that the voltage value of the sensing voltage Vsen correspondingly rises to the voltage value of the reference voltage Vref2 (e.g., 0.5V). That is, when the voltage value of the sensing voltage Vsen is greater than or equal to the voltage value of the reference voltage Vref2, the over current protection mechanism is triggered, so that the modulating circuit 440 reduces the voltage value of the controlling voltage VG. The voltage value of the output voltage VO begins to decrease correspondingly.

At time t2 to t2', when the voltage value of the output voltage VO decreases to the preset value VOD (e.g., 1.8V), the first current sensing circuit 421 is disabled, and the second current sensing circuit 422 is enabled to implement a short circuit protection mechanism. In detail, since the voltage value of the output voltage VO is lower than or equal to the preset value VOD, at time t2, the selecting circuit 430 switches the second selection signal SC from a low voltage level to a high voltage level and generates a rising edge. In addition, at time t2', the selecting circuit 430 switches the first selection signal OC from a high voltage level to a low voltage level and generates a falling edge. In this way, the selecting circuit 430 controls the second current sensing circuit 422 so that the second current sensing circuit 422 is enabled based on the second selection signal SC to output the second sensing signal ISC as the current sensing signal Isen to the sensing node N1.

That is, the current sensing circuits 421 and 422 selectively output the first sensing signal IOC or the second sensing signal ISC as the current sensing signal Isen during the switching period. During the aforementioned switching period, the current sensing circuits 421 and 422 simultaneously output the first sensing signal IOC and the second sensing signal ISC to the sensing node N1, so that the current sensing signal Isen is a continuous signal.

It should be noted that there is a delay period (i.e., switching period) between the time point when the first selection signal SC is switched (i.e., time t2) and the time point when the second selection signal OC is switched (i.e., time t2'). That is, the first selection signal SC and the second selection signal OC overlap at any time point during the period from time t2 to t2', and have the same voltage level. The aforementioned delay period may reduce the signal oscillation generated when different current sensing circuits 421 and 422 are switched, so as to reduce the error of the output current IL.

At time t3, the modulating circuit 440 continues to reduce the voltage value of the controlling voltage VG according to the second sensing signal ISC to be reduced to the voltage Vc. The voltage Vc is the lowest voltage at which the power transistor T13 operates in the saturation region. At this time, the voltage value of the output voltage VO decreases to 0V, and the output current IL is still limited to an output upper limit.

FIG. 5A to FIG. 5D are circuit layout schematic diagrams of a power switch circuit according to an embodiment of the disclosure. Referring to FIG. 5A to FIG. 5D, the power switch circuits 600A to 600D may be respectively, for example, a schematic layout diagram of a part of the circuit elements in the power switch circuit 200 of FIG. 2 to illustrate the layout of the power transistor 213, the first current sensing circuit 221, and the second current sensing circuit 222.

In this embodiment, the power transistor 613 may correspond to the power transistor 213 in FIG. 2. The first current sensing circuit 621 (noted as "OCD") may correspond to the first current sensing circuit 221 in FIG. 2. The second current sensing circuit 622 (noted as "SCD") may correspond to the second current sensing circuit 222 in FIG. 2.

Figure 5A:
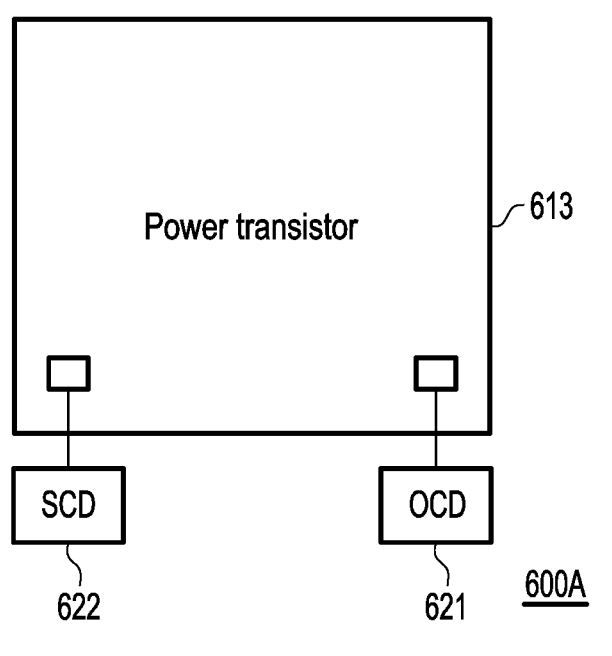
FIG. 5A to FIG. 5D are circuit layout schematic diagrams of a power switch circuit according to an embodiment of the disclosure.

In the embodiment of FIG. 5A, the first current sensing circuit 621 and the second current sensing circuit 622 are respectively disposed on one side of the power transistor 613, and are at the same distance from the power transistor 613. The sensing pads respectively coupled to the first current sensing circuit 621 and the second current sensing circuit 622 are disposed in the power transistor 613. In this embodiment, these sensing pads have the same structure and layout area. There is a preset area ratio between the respective layout areas of these sensing pads and the power transistor 613.

Figure 5B:
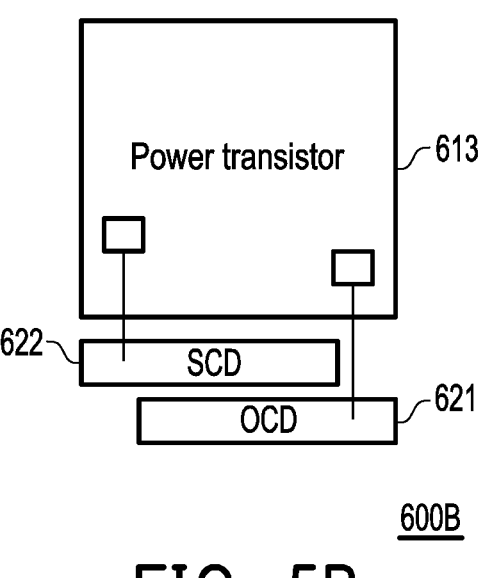

In the embodiment of FIG. 5B, the first current sensing circuit 621 and the second current sensing circuit 622 are respectively disposed on one side of the power transistor 613, and are at different distances from the power transistor 613. The sensing pads respectively coupled to the first current sensing circuit 621 and the second current sensing circuit 622 are disposed in the power transistor 613.

Figure 5C:
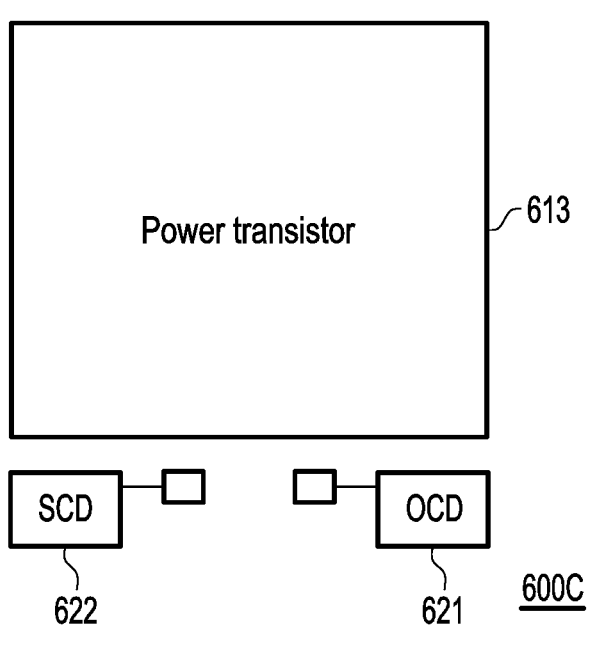

In the embodiment of FIG. 5C, the first current sensing circuit 621 and the second current sensing circuit 622 are respectively disposed on one side of the power transistor 613, and are at the same distance from the power transistor 613. The sensing pads respectively coupled to the first current sensing circuit 621 and the second current sensing circuit 622 are disposed outside the power transistor 613.

Figure 5D:
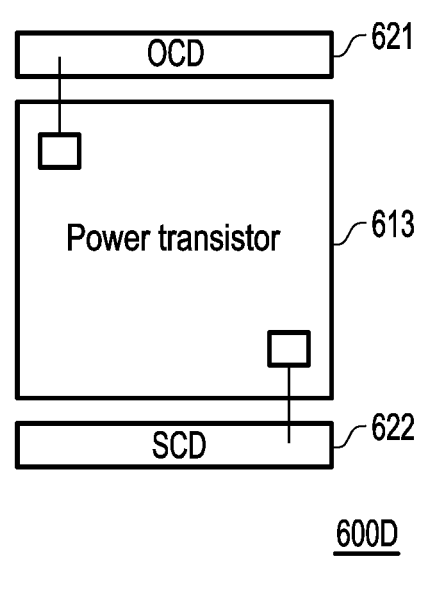

In the embodiment of FIG. 5D, the first current sensing circuit 621 and the second current sensing circuit 622 are respectively disposed at opposite sides of the power transistor 613, and are at the same distance from the power transistor 613. The sensing pads respectively coupled to the first current sensing circuit 621 and the second current sensing circuit 622 are disposed in the power transistor 613.

It should be noted that the first current sensing circuit 621 and the second current sensing circuit 622 have the same circuit architecture and the same layout area. In this way, the mismatch degree between the current sensing circuits 621 and 622 is reduced, so these current sensing circuits 621 and 622 may be quickly switched, so that the current sensing signal Isen may be smoothly switched between the first sensing signal IOC and the second sensing signal ISC without any gap.

To sum up, the power switch circuit of the embodiment of the disclosure may switch the over current detection circuit (i.e., the first current sensing circuit) and the short circuit detection circuit (i.e., the second current sensing circuit) through the selecting circuit to output corresponding sensing signals. In this way, the power switch circuit may provide accurate current sensing in real time. Through matching circuit design and common sensing nodes, the oscillation generated by the output voltage may be reduced, thereby achieving complete current protection and improving the accuracy of current protection. In some embodiments, the use of an isolation circuit allows the sensing circuit to adopt low-voltage elements, thereby reducing circuit costs. In some embodiments, the voltage lower limit of the operation of the current sensing circuit may be reduced through the voltage locking circuit, thereby supporting low input voltage applications. In some embodiments, by using the first current sensing circuit and the second current sensing circuit having the same circuit architecture and the same layout area, the aforementioned matching design may be used to reduce the sensing signal error generated when these circuits are switched.

Although the disclosure has been described in detail with reference to the above embodiments, they are not intended to limit the disclosure. Those skilled in the art should understand that it is possible to make changes and modifications without departing from the spirit and scope of the disclosure. Therefore, the protection scope of the disclosure shall be defined by the following claims.

What is claimed is:

1. A power switch circuit, comprising:
a power switch, having an output terminal for providing an output voltage and an output current;
a sensing circuit, coupled to the power switch, sensing the output current and outputting a current sensing signal;
a selecting circuit, respectively coupled to the output terminal and the sensing circuit, controlling the sensing circuit according to the output voltage, so that the sensing circuit selectively outputs a first sensing signal or a second sensing signal as the current sensing signal; and
a modulating circuit, coupled to the sensing circuit and a control terminal of the power switch, outputting a controlling voltage to the control terminal of the power switch, and modulating the controlling voltage according to the current sensing signal,
wherein the sensing circuit comprises:
a sensing node, coupled to the modulating circuit, outputting the current sensing signal;
a first current sensing circuit, coupled between the power switch and the sensing node, generating the first sensing signal related to the output current; and
a second current sensing circuit, coupled between the power switch and the sensing node, generating the second sensing signal related to the output current,
wherein when the output voltage is higher than a preset value, the selecting circuit controls the sensing circuit to output the first sensing signal to the sensing node, when the output voltage is lower than the preset value, the selecting circuit controls the sensing circuit to output the second sensing signal to the sensing node,
wherein during a switching period in which the sensing circuit selectively outputs the first sensing signal or the second sensing signal as the current sensing signal, the sensing circuit simultaneously outputs the first sensing signal and the second sensing signal to the sensing node.

2. The power switch circuit according to claim 1, wherein the first current sensing circuit is coupled to a sensing transistor in the power switch for sensing the output current to generate the first sensing signal.

3. The power switch circuit according to claim 1, wherein the second current sensing circuit is coupled to a sensing resistor in the power switch for sensing the output current to generate the second sensing signal.

4. The power switch circuit according to claim 1, wherein the first sensing circuit comprises a first current mirror, the second sensing circuit comprises a second current mirror, wherein the first current mirror and the second current mirror are coupled to the sensing node, and the first current mirror and the second current mirror are matched with each other.

5. The power switch circuit according to claim 1, wherein the sensing circuit comprises an isolation circuit coupled between the first sensing circuit and a ground terminal, and between the second sensing circuit and the ground terminal, the isolation circuit isolates the first sensing circuit and the second sensing circuit in a high voltage domain relative to the ground terminal.

6. The power switch circuit according to claim 1, wherein the first current sensing circuit and the second current sensing circuit have the same circuit architecture and the same layout area.

7. The power switch circuit according to claim 1, wherein the modulating circuit comprises a voltage locking circuit coupled to the sensing node for locking a voltage of the sensing node at a first reference voltage.

8. The power switch circuit according to claim 1, wherein the modulating circuit comprises:
a conversion circuit, coupled to the sensing circuit, converting the current sensing signal into a sensing voltage; and
an error amplification circuit, coupled to the conversion circuit and the control terminal of the power switch, respectively receiving the sensing voltage and a second reference voltage for generating the controlling voltage.

9. The power switch circuit according to claim 1, wherein the power switch has an input terminal and comprises:
a sensing resistor, wherein a first terminal of the sensing resistor is coupled to the input terminal
a first sensing transistor, having a control terminal receiving the controlling voltage, wherein a first terminal of the first sensing transistor is coupled to a second terminal of the sensing resistor, a second terminal of the first sensing transistor is coupled to the output terminal;
a second sensing transistor, having a control terminal receiving the controlling voltage, wherein a first terminal of the second sensing transistor is coupled to the input terminal; and
a power transistor, having a control terminal receiving the controlling voltage, wherein a first terminal of the power transistor is coupled to the input terminal, a second terminal of the power transistor is coupled to the output terminal,
wherein the sensing circuit is respectively coupled to a second terminal of the sensing resistor, the output terminal, and a second terminal of the second sensing transistor.

10. The power switch circuit according to claim 9, wherein the first sensing transistor, the second sensing transistor, and the power transistor are matched with each other.

11. The power switch circuit according to claim 9, wherein the first sensing transistor and the second sensing transistor have the same layout area.

* * * * *